(12) United States Patent
Chu

(10) Patent No.: US 10,026,707 B2
(45) Date of Patent: Jul. 17, 2018

(54) WAFER LEVEL PACKAGE AND METHOD

(71) Applicant: Microchip Technology Incorporated, Chandler, AZ (US)

(72) Inventor: George Chu, San Ramon, CA (US)

(73) Assignee: Microchip Technology Incorpotated, Chandler, AZ (US)

( * ) Notice: Subject to any disclaimer, the term of this patent is extended or adjusted under 35 U.S.C. 154(b) by 0 days.

(21) Appl. No.: 15/666,309

(22) Filed: Aug. 1, 2017

(65) Prior Publication Data

US 2018/0090460 A1   Mar. 29, 2018

Related U.S. Application Data

(60) Provisional application No. 62/399,111, filed on Sep. 23, 2016.

(51) Int. Cl.
*H01L 23/00* (2006.01)
*H01L 21/768* (2006.01)
(Continued)

(52) U.S. Cl.
CPC .............. *H01L 24/13* (2013.01); *C23C 14/34* (2013.01); *C25D 5/022* (2013.01); *H01L 21/76885* (2013.01); *H01L 23/3192* (2013.01); *H01L 23/49811* (2013.01); *H01L 23/562* (2013.01); *H01L 24/11* (2013.01); *H01L 24/81* (2013.01);
(Continued)

(58) Field of Classification Search
CPC ............... H01L 24/13; H01L 21/76885; H01L 23/49811; H01L 24/11; H01L 24/81; H01L 2224/0345; H01L 2224/0401; H01L 2224/05647; H01L 2224/10145; H01L 2224/11464; H01L 2924/14; C23C 14/34; C25D 5/022
See application file for complete search history.

(56) References Cited

U.S. PATENT DOCUMENTS 8,637,983 B2 *   1/2014   Martinez .............. G06F 17/5068
                                                               257/734
2005/0242418 A1   11/2005   Yang
(Continued)

OTHER PUBLICATIONS

International Search Report and Written Opinion for PCT/US2017/048260, dated Nov. 27, 2017.

*Primary Examiner* — Karen Kusumakar
(74) *Attorney, Agent, or Firm* — Innovation Counsel LLP (57) ABSTRACT

A copper pillar bump semiconductor packaging method patterns an organic insulation layer formed under the copper pillar bumps to areas surrounding and in the vicinity of the copper pillar bumps only. The organic insulation layer, typically a thin film polymer layer, acts as a barrier layer for the copper pillar bumps to protect the semiconductor wafer during the copper pillar flip chip bonding process. The copper pillar bump semiconductor packaging method limits the areas where the organic insulation layer is applied to reduce the stress introduced to the semiconductor wafer by the organic insulation layer. In another embodiment, a copper pillar bump semiconductor packaging method patterns an organic insulation layer formed under the copper pillar bumps to areas surrounding the copper pillar bumps and along the path of a redistribution layer without using a large and continuous organic insulation layer.

13 Claims, 11 Drawing Sheets

(51) Int. Cl.
  *H01L 23/498* (2006.01)
  *C23C 14/34* (2006.01)
  *C25D 5/02* (2006.01)
  *H01L 23/31* (2006.01)
  *H01L 23/29* (2006.01)

(52) U.S. Cl.
  CPC ............ *H01L 23/293* (2013.01); *H01L 24/03* (2013.01); *H01L 24/05* (2013.01); *H01L 2224/024* (2013.01); *H01L 2224/0215* (2013.01); *H01L 2224/0235* (2013.01); *H01L 2224/0236* (2013.01); *H01L 2224/02126* (2013.01); *H01L 2224/02145* (2013.01); *H01L 2224/02311* (2013.01); *H01L 2224/02351* (2013.01); *H01L 2224/02375* (2013.01); *H01L 2224/02379* (2013.01); *H01L 2224/0345* (2013.01); *H01L 2224/0361* (2013.01); *H01L 2224/03464* (2013.01); *H01L 2224/03912* (2013.01); *H01L 2224/0401* (2013.01); *H01L 2224/05005* (2013.01); *H01L 2224/05008* (2013.01); *H01L 2224/05022* (2013.01); *H01L 2224/05027* (2013.01); *H01L 2224/05082* (2013.01); *H01L 2224/05083* (2013.01); *H01L 2224/05124* (2013.01); *H01L 2224/05155* (2013.01); *H01L 2224/05166* (2013.01); *H01L 2224/05171* (2013.01); *H01L 2224/05569* (2013.01); *H01L 2224/05572* (2013.01); *H01L 2224/05582* (2013.01); *H01L 2224/05583* (2013.01); *H01L 2224/05647* (2013.01); *H01L 2224/10126* (2013.01); *H01L 2224/10145* (2013.01); *H01L 2224/1146* (2013.01); *H01L 2224/1147* (2013.01); *H01L 2224/11464* (2013.01); *H01L 2224/11849* (2013.01); *H01L 2224/131* (2013.01); *H01L 2224/13083* (2013.01); *H01L 2224/13147* (2013.01); *H01L 2224/13155* (2013.01); *H01L 2924/14* (2013.01); *H01L 2924/3511* (2013.01)

(56) References Cited

U.S. PATENT DOCUMENTS

| | | | |
|---|---|---|---|
| 2012/0061823 | A1* | 3/2012 | Wu ............... H01L 23/3157 257/737 |
| 2014/0319695 | A1 | 10/2014 | Hsieh et al. |
| 2016/0254221 | A1 | 9/2016 | Kim et al. |

* cited by examiner

WAFER LEVEL PACKAGE AND METHOD

CROSS REFERENCE TO OTHER APPLICATIONS

This application claims priority to U.S. Provisional Patent Application No. 62/399,111 entitled WAFER LEVEL PACKAGE AND METHOD, filed Sep. 23, 2016 which is incorporated herein by reference for all purposes.

BACKGROUND OF THE INVENTION

Semiconductor packaging using copper pillar bump flip-chip interconnect technology has been widely adopted. Copper pillar bumps are used as the flip chip interconnect between the integrated circuit chip and the package substrate. Copper pillar bump flip-chip interconnect is a type of wafer level packaging where copper pillar bumps are formed on the bond pads of the integrated circuit die after the wafer processing is completed but before the wafer is diced into individual integrated circuit die. More specifically, at the end of wafer processing, the wafer is coated with a final dielectric layer, referred to as the passivation layer, which covers all of the active circuitry of the integrated circuit with only the bond pads exposed. The passivation layer is typically formed using silicon dioxide or silicon nitride. The back end processing of the wafer can then begin where the wafer is processed to form copper pillar bumps on the exposed bond pads of the wafer. After the copper pillar bumps are formed, the wafer is then diced into individual integrated circuit die and each integrated circuit die is assembled in flip-chip configuration onto a package substrate where the copper pillar bumps are used as the flip-chip interconnects to the package substrate.

Figure 1:
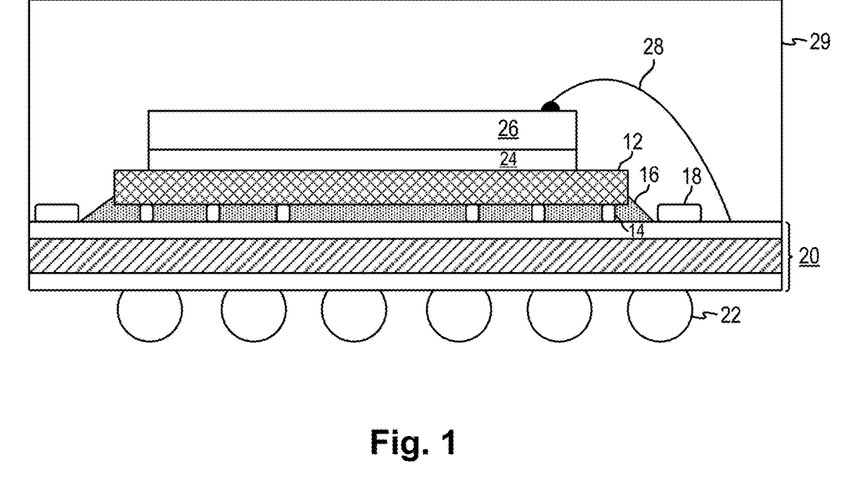
FIG. 1 is a cross-sectional view of a packaged integrated circuit employing copper pillar bump flip-chip interconnect technology in some examples.

FIG. 1 is a cross-sectional view of a packaged integrated circuit employing copper pillar bump flip-chip interconnect technology in some examples. Referring to FIG. 1, an integrated circuit die 12 is packaged in a flip-chip semiconductor package 10. The front side of the integrated circuit die 12, including the active circuitry and the bond pads for external connections, is faced downward in the package. Copper pillar bumps 14 are formed on the bond pads of the integrated circuit 12 and are used as the electrical interconnects between the integrated circuit die 12 and a package substrate 20, usually formed as a printed circuit board (PCB) substrate. The integrated circuit die 12 is flip-chip attached to the package substrate 20. An underfiller material 16 and a dam 18 may be used in the flip-chip attach process.

The PCB package substrate 20 may be a single layer or a multi-layer PCB. The PCB package substrate 20 includes conductive traces printed thereon and formed in the PCB for receiving the copper pillar bumps formed on the integrated circuit die 12 and for electrically connecting the copper pillar bumps formed on the top side of the substrate to an array of solder balls 22 formed on the bottom side of the substrate. The solder balls 22 form the external connections of the semiconductor package 10.

In the present illustration, the integrated circuit die is formed as a silicon on insulator integrated circuit. In the case that the integrated circuit die is used in high voltage applications, there can be significant charge build up on the insulator substrate on the backside of integrated circuit die 12. In some examples, the backside of the integrated circuit die 12 needs to be grounded. Accordingly, a conductive top substrate 26 is formed on the backside of integrated circuit die 12 and attached to the backside through a conductive adhesive 24. A bond wire 28 is used to electrically connect the top substrate 26 to the package substrate 20 for the electrical ground connection. The entire structure is then encapsulated in a mold compound 29 to form the semiconductor package 10.

Figure 2:
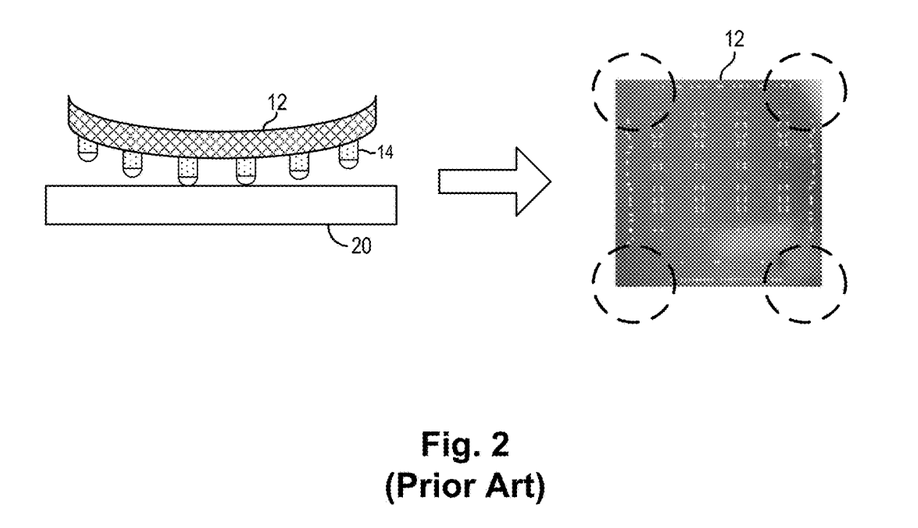
FIG. 2 illustrates a package failure mode due to die warpage in one example.

In the copper pillar bump flip-chip interconnect process, packaging failures due to die warpage have been observed. FIG. 2 illustrates the package failure mode due to die warpage in one example. In the flip-chip interconnect process, after the copper pillar bumps are formed on the wafer, the wafer is subjected to backgrinding to a certain desired die thickness. For example, the wafer may have a thickness of 700 µm and is background to about 100 µm. Then, the wafer is diced up into individual die 12. After being diced up, certain stresses on the integrated circuit die 12 cause the die to warp, as shown in FIG. 2. The warpage on the die 12 prevents the die from being properly attached to the package substrate 20. In particular, due to the die warpage, some of the copper pillar bumps will not be able to make physical contact with the conductive traces on the package substrate 20, leading to open connections at the corners of the die, as shown in FIG. 2.

The die warpage issue typically affects integrated circuit die having a large die size, such as 10 mm×10 mm, and a thin die thickness, such as 100 µm. In some cases, the die warpage can be up to 70 µm, which is 70% of the die thickness. The die warpage issue on integrated circuit dies with large die size but thin die thickness makes flip-chip bonding onto a printed circuit board substrate impossible.

Conventional solutions to the die warpage issue involve increasing the die thickness, such as to backgrind the wafer only to 200 µm or 250 µm thickness. However, a thicker die size is sometimes not desirable as the package thickness is also increased, making the semiconductor package undesirable for certain applications, such as in small mobile devices. In some cases, it is believed that the die warpage is due to the polyimide material applied to the front surface of the integrated circuit die during the back end processing to form the copper pillar bumps. Thus, some conventional solution to the die warpage issue involves using polyimide material with lower curing temperature or lower flex modulus property on the integrated circuit die. These substitution materials sometimes increase the cost of the semiconductor package.

BRIEF DESCRIPTION OF THE DRAWINGS

Various embodiments of the invention are disclosed in the following detailed description and the accompanying drawings.

FIG. 3, which includes FIG. 3(a) to FIG. 3(i), illustrates the conventional back end processing steps for forming a copper pillar bump on a bond pad of the semiconductor wafer.

FIG. 4, which includes FIGS. 4(a) and 4(b), is a cross-sectional view of a copper pillar bump formed on a semiconductor wafer and a top view of an integrated circuit die having copper pillar bumps formed using the conventional back end processing steps of FIG. 3.

FIG. 5, which includes FIGS. 5(a) and 5(b), is a cross-sectional view of a copper pillar bump formed on a redistribution layer and a top view of an integrated circuit die having copper pillar bumps formed on a redistribution layer in some examples.

FIG. 8, which includes

FIG. 9, which includes FIG. 9(a) to FIG. 9(i), illustrates the back end processing steps for forming a copper pillar bump on a bond pad of the semiconductor wafer using the semiconductor packaging method in FIG. 8.

FIG. 10, which includes FIGS. 10(a) and 10(b), is a cross-sectional view of a copper pillar bump formed on a semiconductor wafer and a top view of an integrated circuit die having copper pillar bumps formed using the back end semiconductor packaging method of FIG. 8.

FIG. 11, which includes FIGS. 11(a) and 11(b), is a cross-sectional view of a copper pillar bump using a redistribution layer and a top view of an integrated circuit die formed using the semiconductor packaging method in one embodiment of the present invention.

FIG. 12, which includes FIGS. 12(a) and 12(b), is a cross-sectional view of a copper pillar bump using a redistribution layer and a top view of an integrated circuit die formed using the semiconductor packaging method in an alternate embodiment of the present invention.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

According to embodiments of the present invention, a method to form a copper pillar bump semiconductor package includes patterning an organic insulation layer formed under the copper pillar bumps to areas surrounding and in the vicinity of the copper pillar bumps only. The organic insulation layer, typically a thin film polymer layer, is used as a barrier layer for the copper pillar bumps to protect the semiconductor wafer during the copper pillar bump flip chip bonding process. The semiconductor packaging method of the present invention limits the areas where the organic insulation layer is applied to reduce the stress introduced to the semiconductor wafer by the organic insulation layer.

In other embodiments, a method to form a copper pillar bump semiconductor package using a redistribution process includes patterning an organic insulation layer formed under the copper pillar bumps and the redistribution layer to cover areas surrounding the bond pads and the bump pads, and to form islands of the organic insulation layer along the path of the redistribution layer. When a second organic insulation layer is used on top of the redistribution layer, the second organic insulation layer can also be patterned to cover areas surrounding the bond pads and the bump pads and to form islands of the second organic insulation layer. The islands of the second organic insulation layer may be offset from the islands of the organic insulation layer formed under the redistribution layer. In this manner, one or more organic insulation layers are used to provide stress relief from the copper pillar bump process. However, no large, continuous areas of the organic insulation layers are formed so that the stress induced to the semiconductor wafer by the organic insulation layers is significantly reduced.

In the present description, the organic insulation layer refers to the thin film organic insulating material applied to or coating a semiconductor wafer to protect the wafer during back end processing to form copper pillar bumps. The organic insulation layer is also referred to as a post wafer processing dielectric layer as the organic insulation layer is applied after the semiconductor wafer has completed the wafer fabrication process where the semiconductor wafer is formed with a final dielectric layer—the passivation layer—covering the entire surface of the semiconductor wafer and exposing only bond pads. More specifically, the passivation layer, typically a silicon dioxide layer or a silicon nitride layer, covers all of the active circuitry of the integrated circuit dies formed on the semiconductor wafer with only the bond pads exposed. The back end processing of the semiconductor wafer involves forming copper pillar bumps on the exposed bond pads of the semiconductor wafer to enable the integrated circuit dies formed on the semiconductor wafer to be subsequently packaged, such as in a flip-chip semiconductor package. The organic insulation layer is formed on the finished semiconductor wafer before the copper pillar bumps are formed and is used to provide a mechanical stress buffer between the semiconductor wafer and the copper pillar bumps formed thereon. The organic insulation layer is typically a thin film polymer material, such as polyimide (PI) or polybenzoxazole (PBO).

Figures 3, 3A, 3I:
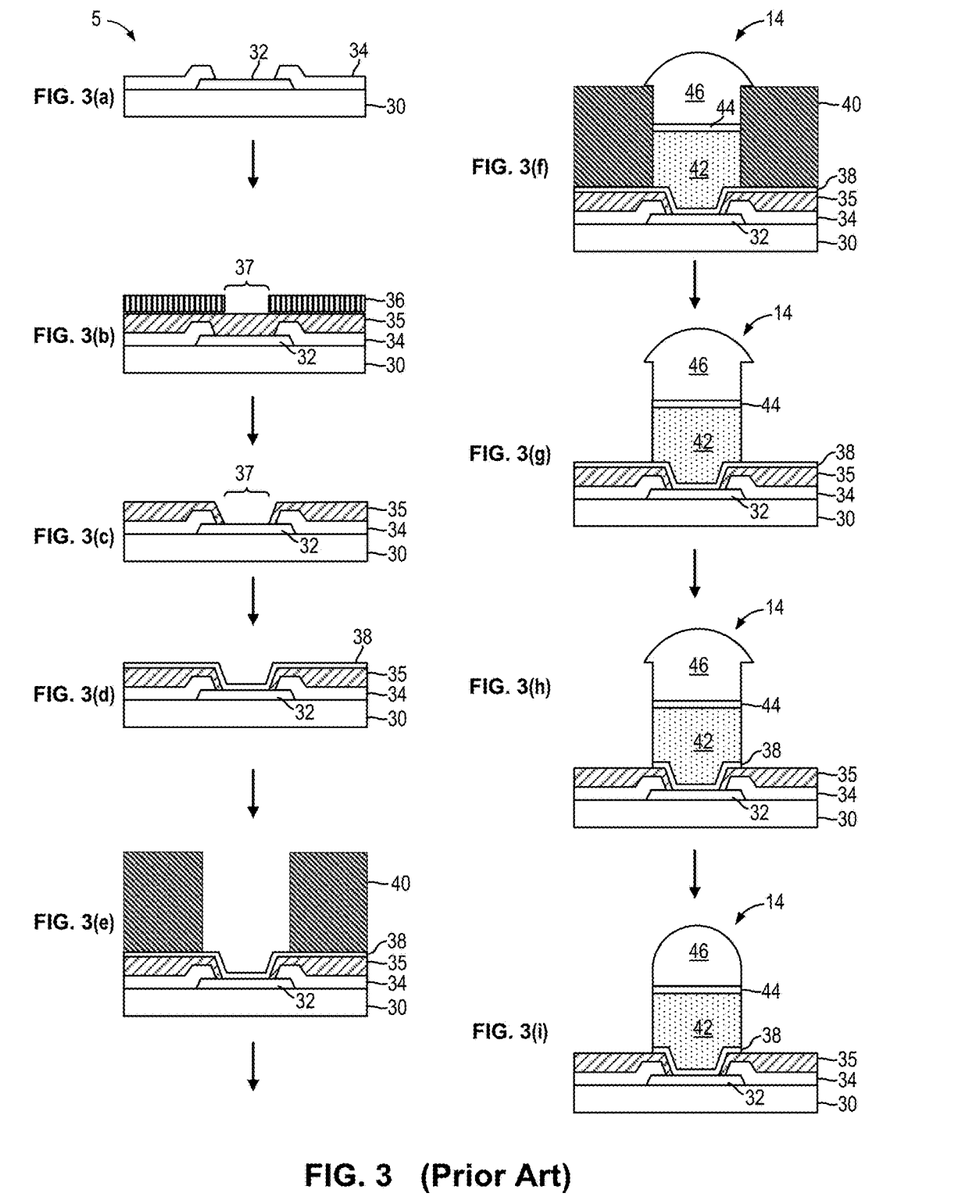
Figures 4, 4A, 4B:
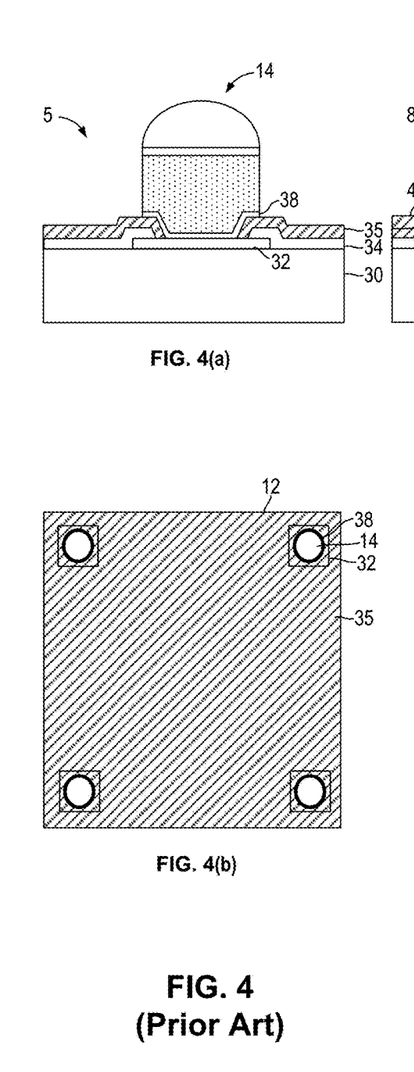

In the conventional back end processing steps, the entire surface of the semiconductor wafer is coated with the organic insulating material with openings made on the bond pads for the copper pillar bumps. FIG. 3, which includes FIG. 3(a) to FIG. 3(i), illustrates the conventional back end processing steps for forming a copper pillar bump on a bond pad of the semiconductor wafer. FIG. 4, which includes FIGS. 4(a) and 4(b), is a cross-sectional view of a copper pillar bump formed on a semiconductor wafer and a top view of an integrated circuit die having copper pillar bumps formed using the conventional back end processing steps of FIG. 3. Referring to both FIGS. 3 and 4, after the front end wafer fabrication process, a semiconductor wafer 5 is formed with a passivation layer 34 formed on a semiconductor substrate 30 having active circuitry formed thereon (FIG. 3(a)). FIG. 3 shows only a portion of the semiconductor wafer 5 where a bond pad 32 is formed on the semiconductor substrate 30. The semiconductor substrate 30 is covered entirely by the passivation layer 34 except for the exposed bond pad 32. The bond pad 32 is typically an aluminum bond pad or copper bond pad.

At the start of the back end processing steps, the semiconductor wafer 5 is coated with an organic insulating material, forming an organic insulation layer 35 (FIG. 3(b)). More specifically, the copper pillar bump flip chip bonding process introduces a lot of stress to the integrated circuit die. To enhance reliability, a dielectric layer, typically an organic insulating material, is applied to the wafer to seal the bond pad openings before the copper pillar bumps are formed. The organic insulation layer 35 coats the wafer surface and exposes only the bond pad 32. The organic insulating material is typically polyimide and the organic insulation layer 35 is referred herein as a polyimide layer.

In particular, the polyimide layer 35 is patterned, such as by using a mask to pattern a photoresist layer 36, to form an opening 37 on the bond pad 32. After the patterning process, the polyimide layer 35 covers the entire semiconductor wafer 5 except for the opening 37 on the bond pad 32 (FIG. 3(c)). Then, a seed metal layer 38 is deposited onto the semiconductor wafer 5 (FIG. 3(d)), such as by sputtering. The seed metal layer 38 is typically formed by sputtering of a titanium-copper (Ti—Cu) layer, or a titanium-nickel-copper (Ti—Ni—Cu) layer, or a titanium/tungsten-copper (TiW—Cu) layer, or an aluminum-nickel-copper (Al—Ni—Cu) layer, or a chromium-chromium/copper-coper (Cr—CrCu—Cu) layer. In other examples, the seed metal layer 38 can be deposited by electroless plating of copper to the wafer. The seed metal layer 38 is used as a plating seed layer to plate the metal and copper pillars to the final thickness of the pillars.

The copper pillar bump process can then begin. The semiconductor wafer 5 is coated with a photoresist layer 40 which is patterned to expose an area above the bond pad 32 (FIG. 3(e)). A copper pillar bump 14 is formed in the opening of the photoresist layer 40, typically by metal plating (FIG. 3(f)). In the present example, the copper pillar bump 14 includes a lower copper layer 42, a nickel adhesion layer 44, and a solder cap layer 46. After the metal plating process, the photoresist layer 40 is removed (FIG. 3(g)). Then, the seed metal layer 38 is etched to remove all exposed seed metal layer 38. Thus, only the portion of the seed metal layer 38 under the copper pillar bump 14 remains (FIG. 3(h)). Then, the semiconductor wafer is subjected to a solder reflow process to complete the formation of the copper pillar bump 14. More specifically, the solder reflow process round out the solder cap layer 46 to form a rounded solder cap for the copper pillar bump (FIG. 3(i)).

Figure 6:
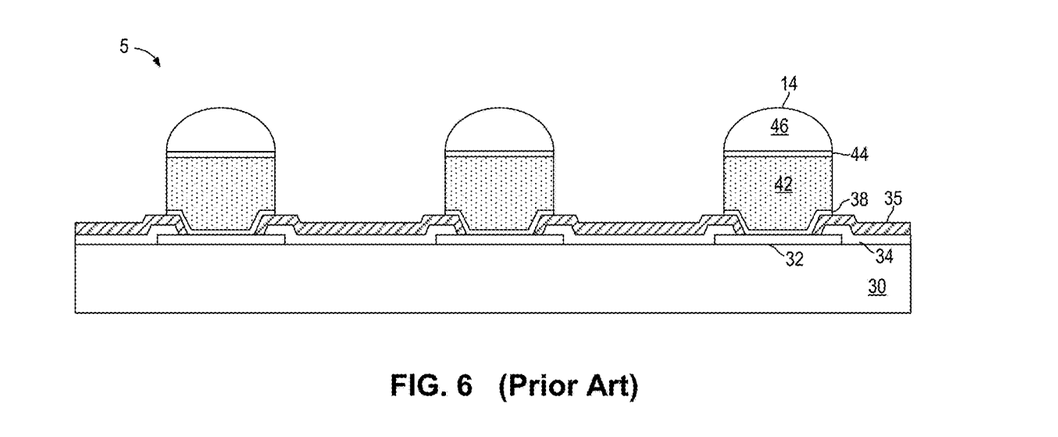
FIG. 6 is another cross-sectional view of the semiconductor wafer in FIGS. 3 and 4 showing a larger portion of the wafer with multiple copper pillar bumps formed thereon.

As a result of the conventional back end processing steps, the entire semiconductor wafer is coated with the polyimide layer except where the copper pillar bumps are formed. FIG. 6 is another cross-sectional view of the semiconductor wafer 5 in FIGS. 3 and 4 showing a larger portion of the wafer with multiple copper pillar bumps 14 formed thereon. As shown in FIGS. 4(b) and 6, an integrated circuit die 12 formed on the semiconductor wafer 5 will have its entire surface covered by the polyimide layer 35 except at the bond pad areas 32 where the copper pillar bumps 14 are formed. The polyimide layer 35 is used as a barrier layer to protect the semiconductor wafer during the copper pillar bump process and to improve the reliability of the integrated circuit thus formed. However, the polyimide layer introduces stress to the semiconductor wafer, especially during the curing process.

More specifically, polyimide and silicon has a large mismatch in the coefficient of thermal expansion (CTE) with polyimide having a much larger thermal expansion and contraction over temperature as compared to silicon. For example, silicon has a CTE of 4 ppm while polyimide has a CTE of 35 ppm. The polyimide layer is deposited on the silicon wafer and then cured at high temperature, such as 350° C. After curing and the temperature of the structure drops, the polyimide layer shrinks much more than the silicon wafer, thereby introducing stress into the silicon wafer. The stress induced in the silicon wafer may not be revealed until the wafer is background and diced up into individual integrated circuit die. Therefore, the wafer is processed through the copper pillar bump process as normal. After backgrinding and wafer dicing, the stress from the polyimide layer often causes the individual die to warp, rending it impossible to attach the die onto a package substrate (FIG. 2).

Figures 5, 5A, 5B:
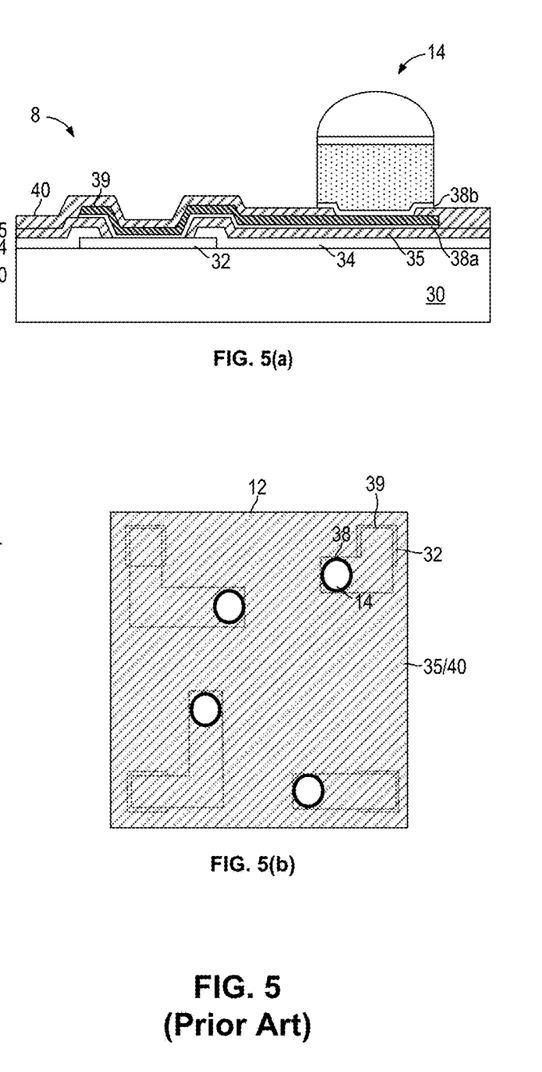

In the above described examples, the copper pillar bump is formed directly on a bond pad. In other examples, the copper pillar bump process can use a redistribution process to form copper pillar bumps away from the bond pads. A redistribution layer (RDL) is a metal layer, such as copper, and is formed on the integrated circuit die to use as runners or traces to re-route bond pads to new bump locations. In this manner, the bump locations can be rearranged on the integrated circuit die and the locations of the copper pillar bumps are not restricted by the layout of the bond pads on the integrated circuit die. FIG. 5, which includes FIGS. 5(a) and 5(b), is a cross-sectional view of a copper pillar bump formed on a redistribution layer and a top view of an integrated circuit die having copper pillar bumps formed on a redistribution layer in some examples. Referring to FIG. 5, a semiconductor wafer is first coated with a first polyimide layer 35 which is patterned to expose the bond pad 32. Then, the redistribution layer 39 is deposited onto the wafer and in the exposed bond pad area. The redistribution layer 39 is typically formed by plating of copper onto an underlying seed metal layer 38a. The redistribution layer 39 forms a metal trace to another location on the semiconductor wafer where the copper pillar bump 14 is to be formed. The semiconductor wafer is coated with a second polyimide layer 40 which is patterned to form an opening at a bump pad area for forming the copper pillar bump 14. The copper pillar bump 14 can then be formed using the process described with reference to FIG. 3. As shown in FIG. 5(b), the integrated circuit die 12 has the two polyimide layers 35 and 40 covering all surfaces of the die except for the bond pads (the first polyimide layer) and the bump pad area (the second polyimide layer).

According to embodiments of the present invention, a semiconductor packaging method for forming copper pillar bumps patterns the organic insulation layer on the semiconductor wafer to only areas surrounding and in the vicinity of the copper pillar bumps only. The organic insulation layer is removed from all other areas of the semiconductor wafer. In this manner, the stress induced onto the semiconductor wafer by the organic insulation layer is significantly reduced or eliminated. The semiconductor packaging method of the present invention enables the use of the copper pillar bumps flip chip technology even for large die size and thin die thickness. For example, the semiconductor packaging method of the present invention can be applied to an integrated circuit die having a die size on the order of 10 mm by 10 mm and a die thickness of 100 µm. Die warpage is avoided by removing the organic insulating material from areas not needed as a barrier protection from the copper pillar bump processing.

Figure 7:
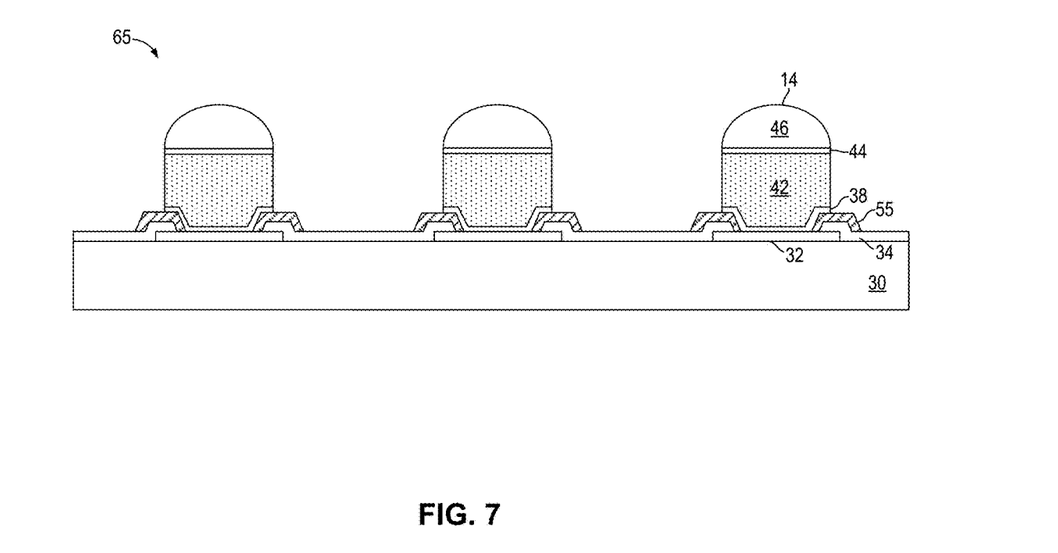
FIG. 7 is a cross-sectional view of a semiconductor wafer having copper pillar bumps formed thereon using the semiconductor packaging method in embodiments of the present invention.

FIG. 7 is a cross-sectional view of a semiconductor wafer having copper pillar bumps formed thereon using the semiconductor packaging method in embodiments of the present invention. Referring to FIG. 7, a semiconductor wafer 65 includes a semiconductor substrate 30 having active circuitry formed thereon. The semiconductor wafer 65 has completed front end wafer fabrication process and is covered by a passivation layer 34 as the final dielectric layer of the wafer fabrication process. The entire surface of the semiconductor wafer 65 is covered by the passivation layer 34 except for the bond pads 32 which are exposed for external connections. The semiconductor packaging method of the present invention forms copper pillar bumps 14 on the bond pads 32. In particular, an organic insulation layer 55 is first formed on the finished semiconductor wafer 65. In particular, an organic insulation layer 55 is patterned to remove the organic insulation layer 55 from all areas except around and in the vicinity of the areas where the copper pillar bumps are to be formed. The copper pillar bumps 14 are then formed with each bump 14 formed on a seed metal layer 38 and each bump including a lower copper layer 42, a nickel adhesion layer 44, and a solder cap layer 46.

As illustrated by a comparison between FIGS. 6 and 7, the semiconductor packaging method of the present invention eliminates substantially all of the organic insulating materials from the wafer surface except under, around and in the vicinity of a copper pillar bump. Thus, instead of having the organic insulating material covering all of the semiconductor wafer as in the conventional method (FIG. 6), the semiconductor packaging method of the present invention forms the organic insulation layer so that the organic insulating material covers only a small portion of the semiconductor wafer. In this manner, the stress induced by the organic insulating material onto the semiconductor wafer is significantly reduced or eliminated and die warpage due to the stress is avoided.

Figure 8:
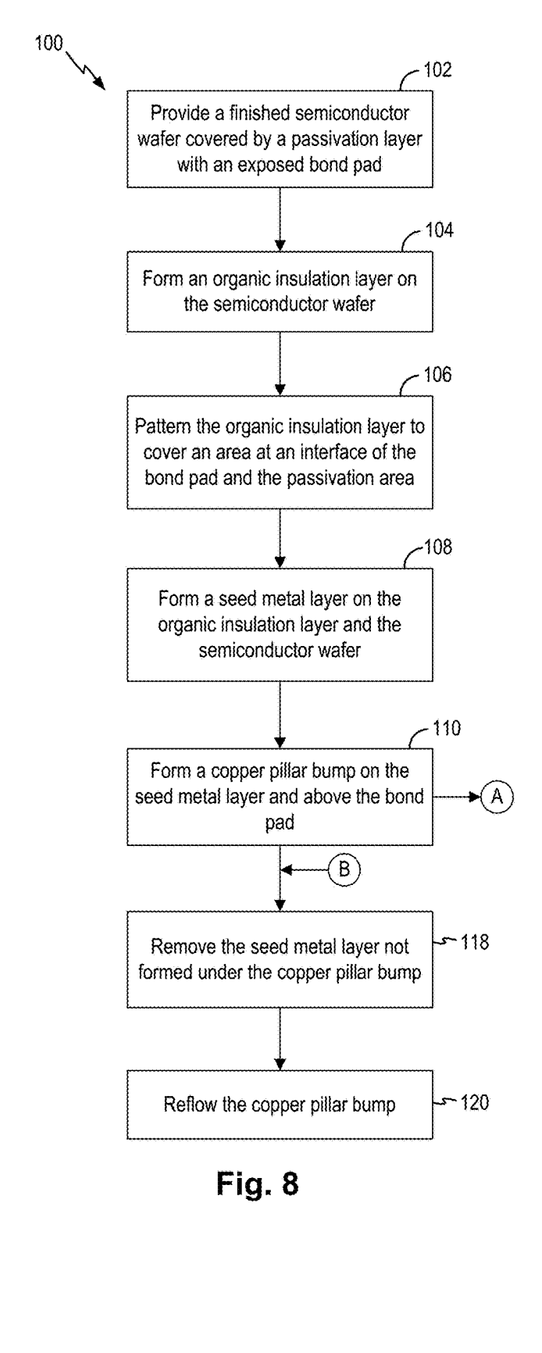
Figure 8A:
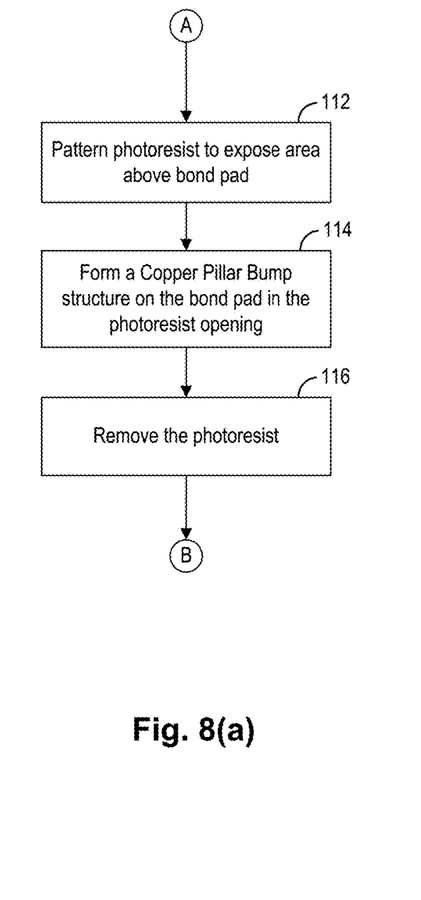
FIG. 8(a), is a flowchart illustrating the semiconductor packaging method for forming copper pillar bumps in embodiments of the present invention.
Figure 9:
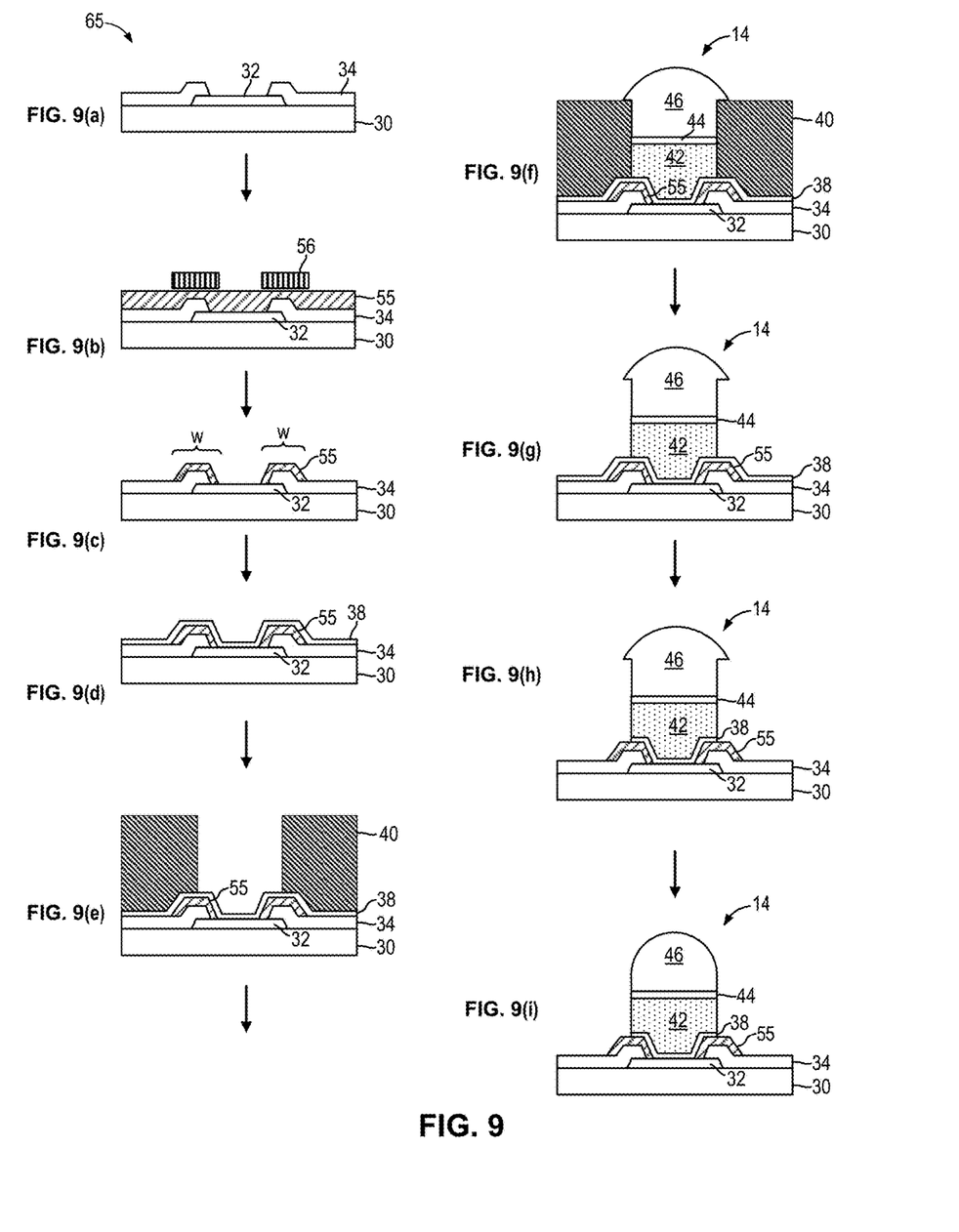
Figure 10:
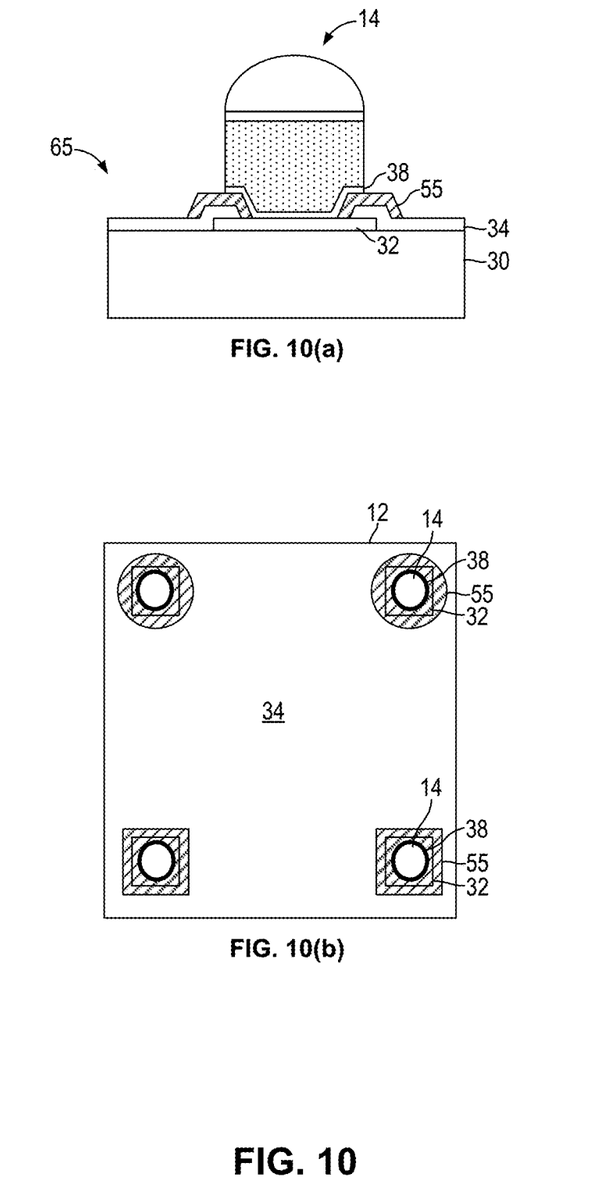

FIG. 8, which includes FIG. 8(a), is a flowchart illustrating the semiconductor packaging method for forming copper pillar bumps in embodiments of the present invention. The semiconductor packaging method of FIG. 8 will be described with reference to the processing steps illustrated in FIG. 9 and the cross-sectional and top view illustrated in FIG. 10. FIG. 9, which includes FIG. 9(a) to FIG. 9(i), illustrates the back end processing steps for forming a copper pillar bump on a bond pad of the semiconductor wafer using the semiconductor packaging method in FIG. 8. FIG. 10, which includes FIGS. 10(a) and 10(b), is a cross-sectional view of a copper pillar bump formed on a semiconductor wafer and a top view of an integrated circuit die having copper pillar bumps formed using the back end semiconductor packaging method of FIG. 8. Referring to FIGS. 8, 9 and 10, the semiconductor packaging method 100 of the present invention starts with a semiconductor wafer 65 having completed front end wafer fabrication processes (102). After the front end wafer fabrication process, the semiconductor wafer 65 is formed with a passivation layer 34 formed on a semiconductor substrate 30 having active circuitry formed thereon (FIG. 9(a)). FIG. 9 shows only a portion of the semiconductor wafer 65 where a bond pad 32 is formed on the semiconductor substrate 30. The semiconductor substrate 30 is covered entirely by the passivation layer 34 except for the exposed bond pad 32. The bond pad 32 is typically an aluminum bond pad or copper bond pad.

The semiconductor packaging method 100 starts the back end processing by coating the semiconductor wafer 65 with an organic insulating material, forming an organic insulation layer 55 (104), as shown in FIG. 9(b). The organic insulating material can be polyimide (PI) or polybenzoxazole (PBO) or other suitable thin film polymer material. The organic insulation layer 55 is then patterned, such as by using a mask to pattern a photoresist 56, to remove the organic insulation layer 55 everywhere except in areas around the interface between the bond pad 32 and passivation layer 34 (106), as shown in FIG. 9(c). More specifically, after the patterning process, the organic insulation layer 55 is removed everywhere on the wafer surface but covers an area around the edge of the bond pad 32 and the passivation layer 34. The organic insulation layer 55 covers and surrounds the interface area of the bond pad and the passivation layer with an overlap width "w" sufficient to act as a stress buffer layer for the copper pillar bump to be formed. The bond pad 32 is exposed and the rest of the passivation layer 34 is also exposed.

Then, a seed metal layer 38 is deposited onto the semiconductor wafer 65 (108), as shown in FIG. 9(d). For example, the seed metal layer 38 is formed by sputtering of a metal layer. In some examples, the seed metal layer 38 is formed by sputtering of a titanium-copper (Ti—Cu) layer, or a titanium-nickel-copper (Ti—Ni—Cu) layer, or a titanium/tungsten-copper (TiW—Cu) layer, or an aluminum-nickel-copper (Al—Ni—Cu) layer, or a chromium-chromium/copper-coper (Cr—CrCu—Cu) layer. In other examples, the seed metal layer 38 can be deposited by electroless plating of copper to the wafer. The seed metal layer 38 is used as a plating seed layer to plate the metal and copper pillars to the final thickness of the pillars. In some examples, the seed metal layer 38 has a thickness between 0.15 µm and 0.5 µm.

The method 100 then forms the copper pillar bump on the seed metal layer 38 and above the bond pad (110). In one example, the copper pillar bump can be formed using the method shown in FIG. 8(a) where the semiconductor wafer 65 is coated with a photoresist layer 40 which is patterned to expose an area above the bond pad 32 (112), as shown in FIG. 9(e). The method 100 then forms a copper pillar bump structure 14 in the opening of the photoresist layer 40 (114), such as by use of metal plating, as shown in FIG. 9(f). In the present embodiment, the copper pillar bump 14 includes a lower copper layer 42, a nickel adhesion layer 44, and a solder cap layer 46. After the metal plating process, the photoresist layer 40 is removed (116) and the copper pillar bump is formed as shown in FIG. 9(g). After the copper pillar bump 14 is formed, the method 100 continues with the etching of the seed metal layer 38 to remove all exposed seed metal layer (118). Thus, only the portion of the seed metal layer 38 under the copper pillar bump 14 remains, as shown in FIG. 9(h). Then, the method 100 performs a solder reflow process on the semiconductor wafer 65 to complete the formation of the copper pillar bump 14 (120). More specifically, the solder reflow process round out the solder cap layer 46 to form a rounded solder cap for the copper pillar bump, as shown in FIG. 9(i).

As a result of the semiconductor packaging method 100, copper pillar bumps are formed on the semiconductor wafer 65 with only small portions of the wafer being covered by the organic insulating material, as shown in FIG. 10(b). In particular, the organic insulation layer 55 is patterned to seal the bond pad and passivation layer interface. The organic insulation layer 55 can be patterned to have a circular shape or a square or rectangular shape conforming to the bond pads. The organic insulation layer 55 as thus formed provides the necessary protection to the semiconductor wafer 65 as the bond pad and passivation layer interface areas are the areas that need protection from the stress of the copper pillar bump flip chip bonding process and that can benefit from protection by the organic insulation layer. Other areas of the semiconductor wafer are covered by the passivation layer and do not need the protection of the organic insulation layer 55. The semiconductor packaging method of the present invention enables the use of copper pillar bump flip chip technology without compromising reliability while avoiding die warpage issues due to the stress of the organic insulation layer.

In the above described embodiments, the semiconductor packaging method of the present invention is applied to form copper pillar bumps that are located on the bond pads of a semiconductor wafer. In other embodiments, the semiconductor packaging method of the present invention can be applied to a copper pillar bump process using a redistribution layer to form the copper pillar bumps away from the bond pads of the semiconductor wafer. When the copper pillar bump is formed on a redistribution layer, the conventional process uses two polyimide layers, as described in FIG. 5. According to embodiments of the present invention, the semiconductor packaging method is applied to a copper pillar bump process using a redistribution layer where one or more organic insulation layers are patterned so that no large, continuous areas of the organic insulation layers are formed. In some embodiments, the topmost organic insulation layer is eliminated entirely.

Figures 11, 11A, 11B:
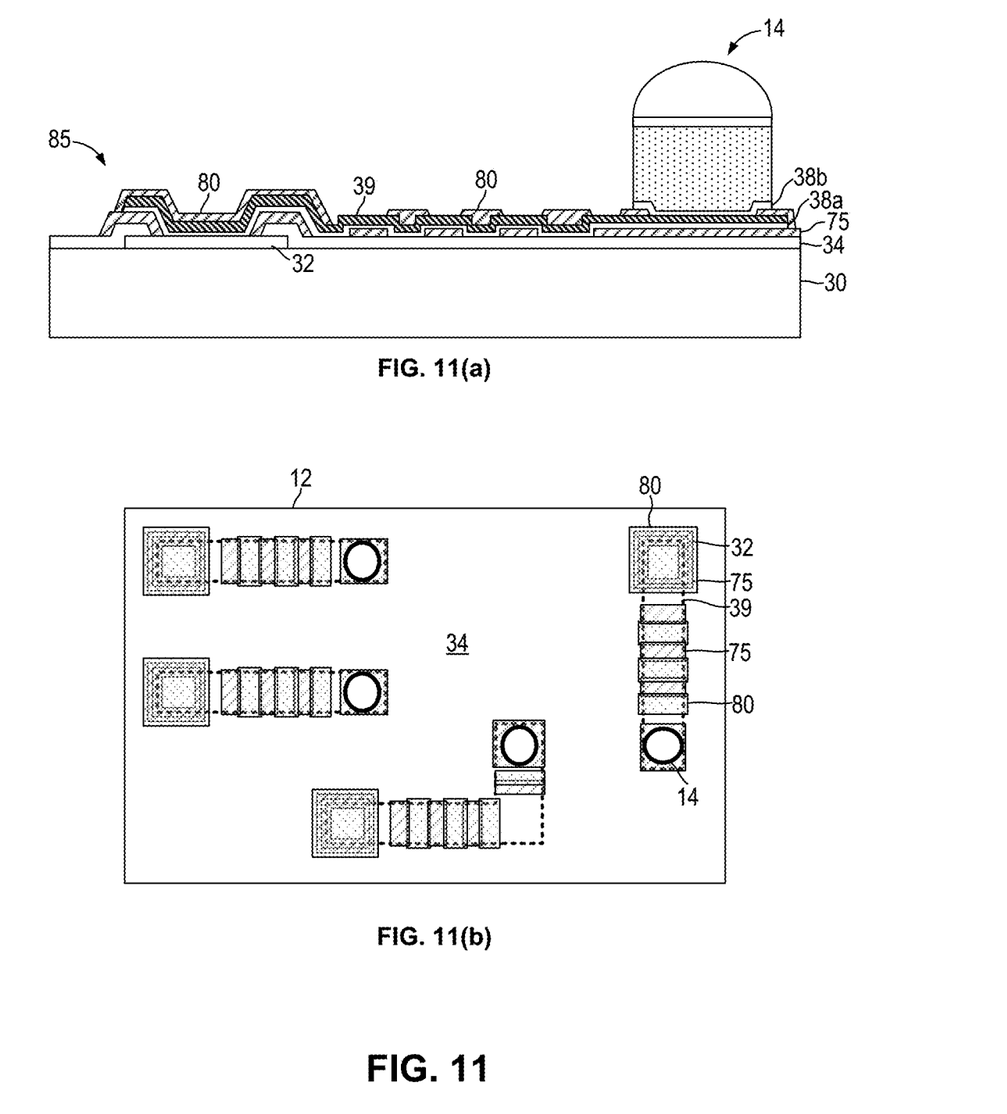
Figure 13:
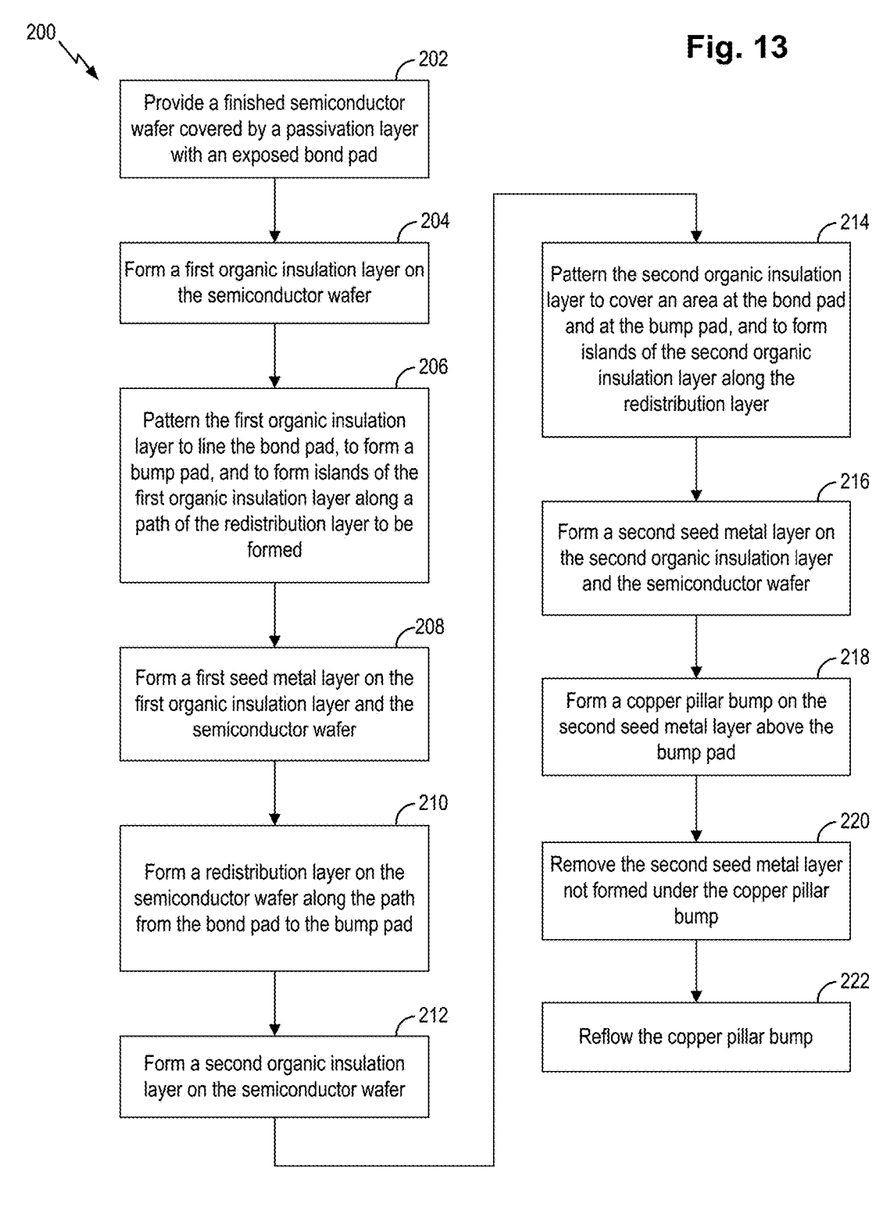
FIG. 13 is a flowchart illustrating the semiconductor packaging method for forming copper pillar bumps using a redistribution layer in embodiments of the present invention.

FIG. 11, which includes FIGS. 11(a) and 11(b), is a cross-sectional view of a copper pillar bump using a redistribution layer and a top view of an integrated circuit die formed using the semiconductor packaging method in one embodiment of the present invention. FIG. 13 is a flowchart illustrating the semiconductor packaging method for forming copper pillar bumps using a redistribution layer in embodiments of the present invention. Referring to FIGS. 11 and 13, the semiconductor packaging method 200 of the present invention starts with a semiconductor wafer 85 having completed front end wafer fabrication processes (202). After the front end wafer fabrication process, the semiconductor wafer 85 is formed with a passivation layer 34 formed on a semiconductor substrate 30 having active circuitry formed thereon. FIG. 11 shows only a portion of the semiconductor wafer 85 where a bond pad 32 is formed on the semiconductor substrate 30. The semiconductor substrate 30 is covered entirely by the passivation layer 34 except for the exposed bond pad 32. The bond pad 32 is typically an aluminum bond pad or copper bond pad.

The semiconductor packaging method 200 starts the back end processing by coating the semiconductor wafer 85 with an organic insulating material, forming a first organic insulation layer 75 (204). The organic insulating material can be polyimide (PI) or polybenzoxazole (PBO) or other suitable thin film polymer material. The first organic insulation layer 75 is then patterned, such as by using a mask to pattern a photoresist, to remove the first organic insulation layer 75 everywhere except in areas around the interface between the bond pad 32 and passivation layer 34 and in an area forming the bump pad (206). The first organic insulation layer 75 is patterned to seal the bond pad and passivation layer interface and to form a buffer layer as a bump pad for the copper pillar bump to be formed. The first organic insulation layer 75 is further patterned to form islands of the organic material along the path of the redistribution layer to be formed. The islands of organic material may have a size of around 1 mm to 5 mm. More specifically, the organic insulation layer 75 remains in areas to act as a stress buffer layer for the copper pillar bump to be formed. The bond pad 32 is exposed and the rest of the passivation layer 34 is also exposed, as shown in FIG. 11(b).

Then, a first seed metal layer 38a is deposited onto the semiconductor wafer 85 (208). In some examples, the first seed metal layer 38a is formed by sputtering of a metal layer, in the same manner as described above with reference to FIG. 8. A redistribution layer 39 is then formed on the semiconductor wafer 85, on top of the first seed metal layer 38a (210). In some examples, the semiconductor wafer 85 is patterned using a photoresist to define areas where the runners or tracers of the redistribution layer are to be formed. Then, a plating process is used to form the redistribution metallization on the first seed metal layer 38a. The first seed metal layer 38a is etched at this time to remove the first seed metal layer everywhere except under the redistribution layer 39. In some examples, the first seed metal layer 38a has a thickness between 0.15 µm to 0.5 µm. Meanwhile, the redistribution layer has a thickness between 5-10 µm.

The method 200 may continue with forming a second organic insulation layer 80 on the semiconductor wafer 85 (212). The second organic insulation layer 80 is patterned in a manner similar to the first organic insulation layer (214). In the example shown in FIG. 11, the second organic insulation layer 80 is formed covering the bond pad and defining a bump pad which exposes the redistribution layer 39 and on which the copper pillar bump will be formed. Furthermore, the second organic insulation layer 80 is patterned to form islands of organic insulation material along the path of the redistribution layer formed. The islands of the second organic insulation layer may be offset from the islands of the first organic insulation layer, as shown in FIG. 11.

According to embodiments of the present invention, the first and second organic insulation layers are patterned so that sufficient areas of the organic insulation material are provided for stress relief from the copper pillar bump process but no large, continuous areas of the organic insulation material are formed to induce stress into the semiconductor wafer. The pattern, size and shape of the organic insulation layers 75 and 80 formed on the semiconductor wafer 85 in FIG. 11 are illustrative only and are not intended to be limiting. Other shapes, sizes and pattern of the organic insulation layers may be used to achieve stress relief desired without inducing additional stress into the wafer.

The method 200 continues with depositing a second seed metal layer 38b on the semiconductor wafer 85 (216). The method 200 then forms the copper pillar bump on the seed metal layer 38b and above the bump pad (218). In one example, the copper pillar bump can be formed using the method shown in FIG. 8(a) and described above. After the copper pillar bump 14 is formed, the method 200 continues with the etching of the seed metal layer 38b to remove all exposed seed metal layer 38b (220). Thus, only the portion of the seed metal layer 38b under the copper pillar bump 14 remains, as shown in FIG. 11(a). Then, the method 200 performs a solder reflow process on the semiconductor wafer 85 to complete the formation of the copper pillar bump 14 (222). More specifically, the solder reflow process round out the solder cap layer to form a rounded solder cap for the copper pillar bump.

Figures 12, 12A, 12B:
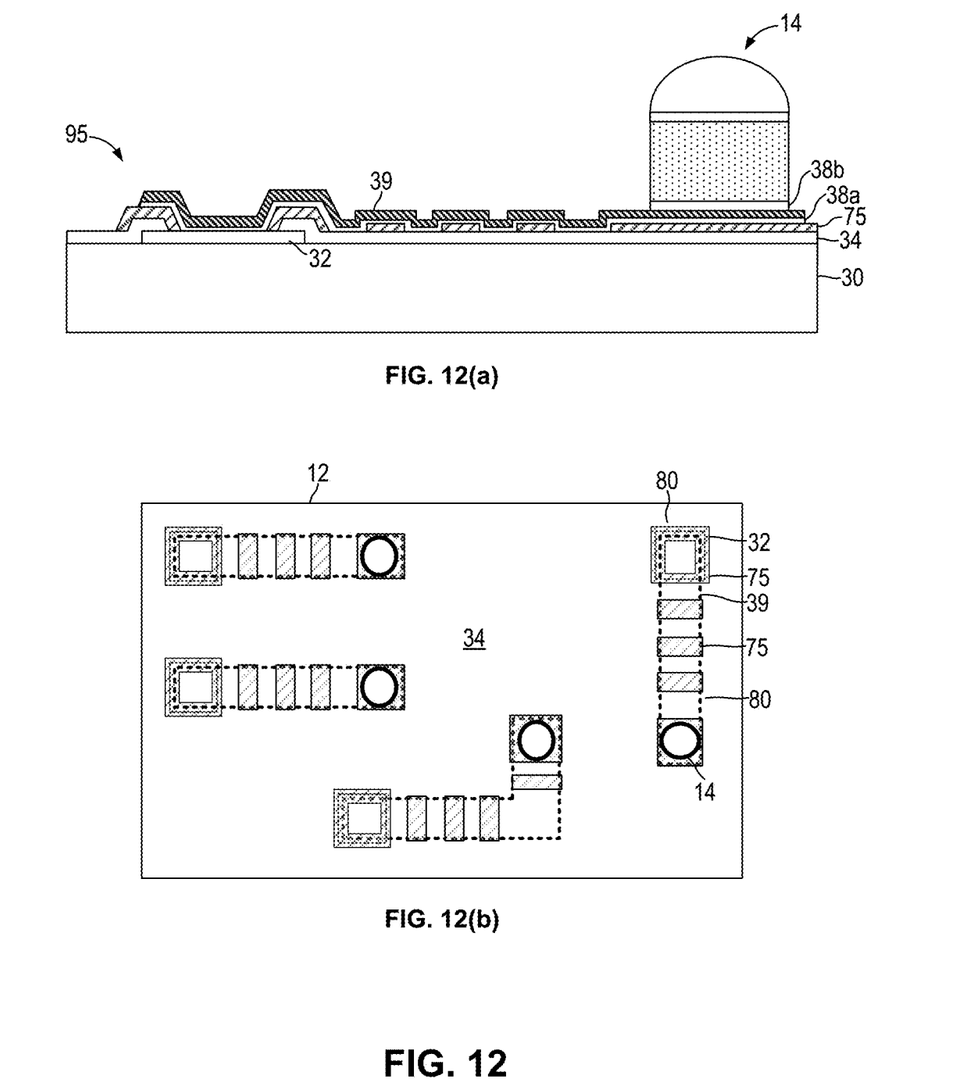
Figure 14:
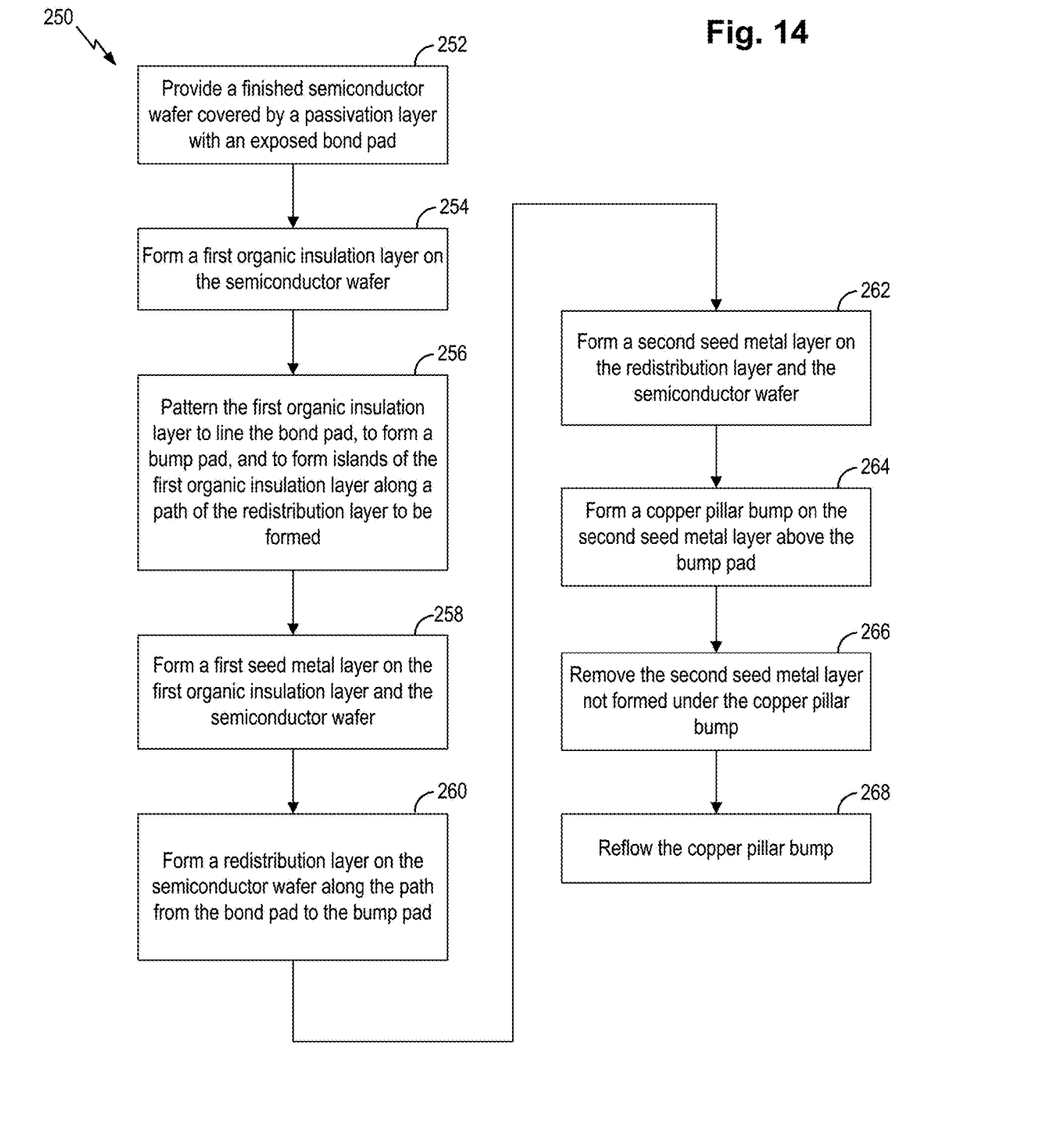
FIG. 14 is a flowchart illustrating the semiconductor packaging method for forming copper pillar bumps using a redistribution layer in embodiments of the present invention.

In an alternate embodiment of the present invention, the semiconductor package method is applied to form a copper pillar bump using a redistribution layer where the second organic insulation layer is entirely omitted, as shown in FIG. 12. FIG. 12, which includes FIGS. 12(a) and 12(b), is a cross-sectional view of a copper pillar bump using a redistribution layer and a top view of an integrated circuit die formed using the semiconductor packaging method in an alternate embodiment of the present invention. FIG. 14 is a flowchart illustrating the semiconductor packaging method for forming copper pillar bumps using a redistribution layer in embodiments of the present invention. Referring to FIGS. 12 and 14, the semiconductor packaging method 250 of the present invention starts with a semiconductor wafer 95 having completed front end wafer fabrication processes (252). After the front end wafer fabrication process, the semiconductor wafer 95 is formed with a passivation layer 34 formed on a semiconductor substrate 30 having active circuitry formed thereon. FIG. 12 shows only a portion of the semiconductor wafer 95 where a bond pad 32 is formed on the semiconductor substrate 30. The semiconductor substrate 30 is covered entirely by the passivation layer 34 except for the exposed bond pad 32. The bond pad 32 is typically an aluminum bond pad or copper bond pad.

The semiconductor packaging method 250 starts the back end processing by coating the semiconductor wafer 95 with an organic insulating material, forming a first organic insulation layer 75 (254). The organic insulating material can be polyimide (PI) or polybenzoxazole (PBO) or other suitable thin film polymer material. The first organic insulation layer 75 is then patterned, such as by using a mask to pattern a photoresist, to remove the first organic insulation layer 75 everywhere except in areas around the interface between the bond pad 32 and passivation layer 34 and in an area forming the bump pad (256). The first organic insulation layer 75 is further patterned to form islands of the organic material along the path of the redistribution layer to be formed. In one embodiment, the first organic insulation layer 75 is patterned in the same manner as described above with reference to FIG. 13.

Then, a first seed metal layer 38a is deposited onto the semiconductor wafer 95 (258), such as by sputtering. A redistribution layer 39 is then formed on the semiconductor wafer 95, on top of the first seed metal layer 38a (260). In some examples, the semiconductor wafer 95 is patterned using a photoresist to define areas where the runners or tracers of the redistribution layer are to be formed. Then, a plating process is used to form the redistribution metallization on the first seed metal layer 38a. The first seed metal layer 38a is etched at this time to remove the first seed metal layer everywhere except under the redistribution layer 39.

The method 250 then continues with depositing a second seed metal layer 38b on the semiconductor wafer 95 (262), without using any more organic insulation layers. The method 250 then forms the copper pillar bump on the seed metal layer 38b and above the bump pad (264). In one example, the copper pillar bump can be formed using the method shown in FIG. 8(a) and described above. After the copper pillar bump 14 is formed, the method 250 continues with the etching of the seed metal layer 38b to remove all exposed seed metal layer 38b (266). Thus, only the portion of the seed metal layer 38b under the copper pillar bump 14 remains, as shown in FIG. 12(a). Then, the method 250 performs a solder reflow process on the semiconductor wafer 95 to complete the formation of the copper pillar bump 14 (268). More specifically, the solder reflow process round out the solder cap layer to form a rounded solder cap for the copper pillar bump.

In the embodiment shown in FIG. 12, the copper pillar bump 14 is formed on the redistribution layer 39 without the use of a second organic insulation layer. Although the redistribution layer 39 is exposed in the semiconductor wafer in this packaging stage, subsequent packaging process will encapsulate the integrated circuit die, such as using an epoxy material, thereby sealing and protecting the redistribution layer.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of forming a copper pillar bump semiconductor package, comprising:
   providing a finished semiconductor wafer comprising a semiconductor substrate having a passivation layer formed thereon covering a top surface of the semiconductor substrate and exposing a bond pad;
   forming a first organic insulation layer on the semiconductor wafer;
   patterning the first organic insulation layer to cover a first area at an interface of the bond pad and the passivation layer, to cover a second area of a bump pad to be formed, and to form islands of the first organic insulation layer along a path of a redistribution layer to be formed from the bond pad to the bump pad, the first organic insulation layer being removed from the bond pad and from the remaining area of the semiconductor wafer outside the first area, the second area and the islands of first organic insulation layer;
   forming a first seed metal layer on the first organic insulation layer and the semiconductor wafer;
   forming the redistribution layer on the semiconductor wafer over the bond pad and the first organic insulation layer, the redistribution layer being formed to include the bump pad being spaced apart from the bond pad and a conductive trace connecting the bond pad to the bump pad, the bump pad being formed over the second area of the first organic insulation layer and the conductive trace being formed over the islands of the first organic insulation layer;
   removing the first seed metal layer not formed under the redistribution layer;
   forming a second seed metal layer on the redistribution layer and the semiconductor wafer;
   forming a copper pillar bump on the second seed metal layer and above the bump pad;
   removing the second seed metal layer not formed under the copper pillar bump; and
   reflowing the copper pillar bump.

2. The method of claim 1, wherein forming the first organic insulation layer on the semiconductor wafer comprises:
   forming the first organic insulation layer on the semiconductor wafer, the first organic insulation layer comprising a thin film polymer material.

3. The method of claim 2, wherein the first organic insulation layer comprises polyimide (PI) or polybenzoxazole (PBO).

4. The method of claim 1, wherein patterning the first organic insulation layer to cover the first area at the interface of the bond pad and the passivation layer comprises:
   patterning the first organic insulation layer to cover the first area at the interface of the bond pad and the passivation layer, the first organic insulation layer overlapping the interface with an overlap width, the first organic insulation layer being removed from the bond pad and from the remaining area of the semiconductor wafer outside the first area, the second area and the islands of first organic insulation layer.

5. The method of claim 4, wherein patterning the first organic insulation layer to cover the first area at the interface of the bond pad and the passivation layer comprises:
patterning the first organic insulation layer in a circular shape to cover the first area at the interface of the bond pad and the passivation layer, the first organic insulation layer overlapping the interface with an overlap width, the first organic insulation layer being removed from the bond pad and from the remaining area of the semiconductor wafer outside the first area, the second area and the islands of first organic insulation layer.

6. The method of claim 4, wherein patterning the first organic insulation layer to cover the area at the interface of the bond pad and the passivation layer comprises:
patterning the first organic insulation layer in a rectangular shape to cover the first area at the interface of the bond pad and the passivation layer, the first organic insulation layer overlapping the interface with an overlap width, the first organic insulation layer being removed from the bond pad and from the remaining area of the semiconductor wafer outside the first area, the second area and the islands of first organic insulation layer.

7. The method of claim 1, wherein forming the first organic insulation layer on the semiconductor wafer and patterning the first organic insulation layer comprises:
forming the first organic insulation layer to cover the entire surface of the semiconductor wafer; and
patterning the first organic insulation layer to remove the organic insulation layer from the surface of the semiconductor wafer except at the first area at the interface of the bond pad and the passivation layer, the second area of the bump pad to be formed and the islands of the first organic insulation layer.

8. The method of claim 1, wherein forming the redistribution layer on the semiconductor wafer comprises:
patterning the semiconductor wafer to expose areas where the redistribution layer is to be formed; and
forming, by plating, a copper layer in the exposed areas as the redistribution layer on the semiconductor wafer.

9. The method of claim 1, further comprising:
after removing the first seed metal layer and before forming the second seed metal layer, forming a second organic insulation layer on the semiconductor wafer over the redistribution layer; and
patterning the second organic insulation layer to cover a third area over and around the bond pad, to cover a fourth area around the bump pad, and to form islands of the second organic insulation layer along the path of the redistribution layer from the bond pad to the bump pad, the second organic insulation layer being removed from the bump pad and from the remaining area of the semiconductor wafer outside the third area and the fourth area,
wherein the second seed metal layer is formed on the semiconductor wafer over the bump pad formed by the redistribution layer and the second organic insulation layer.

10. The method of claim 9, wherein the islands of the second organic insulation layer are formed offset from the islands of the first organic insulating layer.

11. The method of claim 9, wherein forming the second organic insulation layer on the semiconductor wafer over the redistribution layer comprises:
forming the second organic insulation layer on the semiconductor wafer over the redistribution layer, the second organic insulation layer comprising a thin film polymer material.

12. The method of claim 11, wherein the second organic insulation layer comprises polyimide (PI) or polybenzoxazole (PBO).

13. The method of claim 9, wherein forming the second organic insulation layer on the semiconductor wafer and patterning the second organic insulation layer comprises:
forming the second organic insulation layer to cover the entire surface of the semiconductor wafer over the redistribution layer; and
patterning the second organic insulation layer to remove the second organic insulation layer from the surface of the semiconductor wafer except at the third area over and around the bond pad, the fourth area around the bump pad, and the islands of the second organic insulation layer.

* * * * *